United States Patent
Wang et al.

(10) Patent No.: US 11,146,281 B2
(45) Date of Patent: Oct. 12, 2021

(54) MULTI-STAGE SWITCHED CAPACITOR CIRCUIT AND OPERATION METHOD THEREOF

(71) Applicant: REALTEK SEMICONDUCTOR CORPORATION, Hsinchu (TW)

(72) Inventors: Wei-Chou Wang, Hsinchu (TW); Chih-Chien Chang, Hsinchu (TW); Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/096,989

(22) Filed: Nov. 13, 2020

(65) Prior Publication Data
US 2021/0203347 A1 Jul. 1, 2021

(30) Foreign Application Priority Data
Dec. 27, 2019 (TW) ................................ 108148209

(51) Int. Cl.
*H03M 1/44* (2006.01)
*H03M 1/46* (2006.01)
*H03K 17/13* (2006.01)
*H03H 19/00* (2006.01)

(52) U.S. Cl.
CPC .......... *H03M 1/442* (2013.01); *H03H 19/004* (2013.01); *H03K 17/13* (2013.01); *H03M 1/462* (2013.01)

(58) Field of Classification Search
CPC ...... H03M 1/442; H03M 1/462; H03K 17/13; H03H 19/004

USPC .................................................. 341/161, 172
See application file for complete search history.

(56) References Cited

U.S. PATENT DOCUMENTS

| 7,071,863 | B1 * | 7/2006 | Sutardja | ................ | H03M 1/002 341/161 |
| 7,319,425 | B2 * | 1/2008 | Fiorenza | ................ | H03F 3/005 341/172 |
| 9,246,504 | B2 * | 1/2016 | Shen | ...................... | H03M 1/164 |
| 2014/0132438 | A1 | 5/2014 | Shen et al. | | |

OTHER PUBLICATIONS

John K. Fiorenza et al., 2006 Comparator-based switched-capacitor circuits for scaled CMOS technologies, Dec. 2006, p. 2658-2668, vol. 41, No. 12, IEEE Journal of Solid-State Circuits.

(Continued)

*Primary Examiner* — Khai M Nguyen
(74) *Attorney, Agent, or Firm* — WPAT, PC

(57) ABSTRACT

A multi-stage switched capacitor circuit and an operation method thereof are provided. The multi-stage switched capacitor circuit includes a first operational stage, a second operational stage and a third operational stage that are serially connected in order. Each operational stage operates in a sample phase or a hold phase and generates a detection signal indicating an end of the hold phase. The operation method of the multi-stage switched capacitor circuit includes: controlling the second operational stage to operate in the hold phase when the detection signal of the first operational stage indicates the end of the hold phase of the first operational stage, and the detection signal of the third operational stage indicates the end of the hold phase of the third operational stage.

15 Claims, 9 Drawing Sheets

(56) References Cited

OTHER PUBLICATIONS

Pedro M. Figueiredo, Comparator Metastability in the Presence of Noise, May 2013, pp. 1286-1299, vol. 60, No. 5, IEEE Transactions On Circuits and Systems—I: Regular Papers.
Chao Chen et al, A 1V 14b Self-Timed Zero-Crossing-Based Incremental ΔΣ ADC, ISSCC 2013 / Session 15 / Data Converter Techniques /15.4, 2013, IEEE International Solid-State Circuits Conference.
OA letter of counterpart TW application of application No. 108148209 dated Feb. 7, 2020. Summary of TW OA letter: Claims 1 and 6 are anticipated by reference 1 (US 20140132438 A1).

* cited by examiner

S210 — controlling the $n^{th}$ operational stage to operate in the hold phase when the detection signal of the $(n-1)^{th}$ operational stage indicates the end of the hold phase of the $(n-1)^{th}$ operational stage and the detection signal of the $(n+1)^{th}$ operational stage indicates the end of the hold phase of the $(n+1)^{th}$ operational stage S212 — based on both the detection signal of the $(n-1)^{th}$ operational stage and the detection signal of the $(n+1)^{th}$ operational stage, controlling the first end of the capacitor $C1\_n$ of the $n^{th}$ operational stage to be electrically connected to the output terminal of the $n^{th}$ operational stage, controlling the first end of the capacitor $C2\_n$ of the $n^{th}$ operational stage to receive the reference voltage $V\_DAC$, and controlling the second end of the capacitor $C1\_n$ of the $n^{th}$ operational stage and the second end of the capacitor $C2\_n$ of the $n^{th}$ operational stage to be electrically connected to the voltage level detection circuit of the $n^{th}$ operational stage

FIG. 2A

S220 — based on both the detection signal of the $(n-1)^{th}$ operational stage and the detection signal of the $(n+1)^{th}$ operational stage, controlling the first end of the capacitor C1_n+1 of the $(n+1)^{th}$ operational stage and the first end of the capacitor C2_n+1 of the $(n+1)^{th}$ operational stage to be electrically connected to the input terminal of the $(n+1)^{th}$ operational stage, and controlling the second end of the capacitor C1_n+1 of the $(n+1)^{th}$ operational stage and the second end of the capacitor C2_n+1 of the $(n+1)^{th}$ operational stage to receive the reference voltage Vcm

FIG. 2B

S230 — based on the detection signal of the $n^{th}$ operational stage, controlling the first end of the capacitor $C1\_n$ of the $n^{th}$ operational stage not to be electrically connected to the output terminal of the $n^{th}$ operational stage, controlling the first end of the capacitor $C2\_n$ of the $n^{th}$ operational stage not to receive the reference voltage V_DAC, and controlling the second end of the capacitor $C1\_n$ of the $n^{th}$ operational stage and the second end of the capacitor $C2\_n$ of the $n^{th}$ operational stage not to be electrically connected to the voltage level detection circuit of the $n^{th}$ operational stage

FIG. 2C

S240 — based on the detection signal of the $n^{th}$ operational stage, controlling the first end of the capacitor $C1\_n+1$ of the $(n+1)^{th}$ operational stage and the first end of the capacitor $C2\_n+1$ of the $(n+1)^{th}$ operational stage not to be electrically connected to the input terminal of the $(n+1)^{th}$ operational stage, and controlling the second end of the capacitor $C1\_n+1$ of the $(n+1)^{th}$ operational stage and the second end of the capacitor $C2\_n+1$ of the $(n+1)^{th}$ operational stage not to receive the reference voltage Vcm

FIG. 2D

MULTI-STAGE SWITCHED CAPACITOR CIRCUIT AND OPERATION METHOD THEREOF

BACKGROUND OF THE INVENTION

1. Field of the Invention

This disclosure generally relates to switched capacitor circuits, and, more particularly, to zero crossing switched capacitor circuits or comparator-based switched capacitor circuits.

2. Description of Related Art

The conventional zero-crossing-based or comparator-based switched capacitor circuit includes multiple operational stages connected in series, and these operational stages operate in a sample phase or a hold phase in accordance with the system clock. When one of the operational stages (hereinafter referred to as the target operational stage) is operating in the sample phase, another operational stage electrically connected to the target operational stage is operating in the hold phase, and when the target operational stage is operating in the hold phase, another operational stage electrically connected to the target operational stage is operating in the sample phase. However, the switched capacitor circuits of this type lack operation flexibilities because their operations are controlled by the system clock. For example, due to the sample phase and the hold phase both having a fixed time length pursuant to the system clock, the output voltage of the target operational stage may not become stable before the end of the hold phase, resulting in errors in the sampled voltage of the next following operational stage. Such errors may result from variations in manufacturing process, voltage and temperature, which cause the initially designed sample phase and/or hold phase to be shorter than the practical time length that the sample phase and/or hold phase require(s) for normal operations.

SUMMARY OF THE INVENTION

In view of the issues of the prior art, an object of this disclosure is to provide a highly accurate switched capacitor circuit, so as to make an improvement to the prior art.

A switched capacitor circuit is provided. The switched capacitor circuit includes a first operational stage, a second operational stage and a third operational stage serially connected in sequence. Each operational stage generates a detection signal. The first operational stage, the second operational stage and the third operational stage each includes an input terminal, an output terminal, a first capacitor, a second capacitor, a voltage level detection circuit, multiple switches, a current source and a control circuit. The first capacitor has a first end and a second end. The second capacitor has a third end and a fourth end. The voltage level detection circuit is configured to detect a voltage of the second end of the first capacitor and a voltage of the fourth end of the second capacitor to generate a current source control signal and the detection signal. The detection signal indicates that the voltage of the second end of the first capacitor and the voltage of the fourth end of the second capacitor are substantially the same as a reference voltage. The switches are coupled to the first capacitor, the second capacitor, the input terminal, the output terminal and the voltage level detection circuit. The current source is coupled to the output terminal and configured to supply current to the output terminal or to draw current from the output terminal based on the current source control signal. The control circuit is coupled to the switches and configured to control the switches based on the detection signal of the first operational stage, the detection signal of the second operational stage and/or the detection signal of the third operational stage.

An operation method of a switched capacitor circuit is also provided. The switched capacitor circuit includes a first operational stage, a second operational stage and a third operational stage serially connected in sequence. Each operational stage operates in a sample phase or a hold phase and generates a detection signal indicating an end of the hold phase. The first operational stage, the second operational stage and the third operational stage each includes an input terminal, an output terminal, a first capacitor, a second capacitor, a voltage level detection circuit, multiple switches and a current source. The first capacitor has a first end and a second end. The second capacitor has a third end and a fourth end. The voltage level detection circuit is configured to detect a voltage of the second end of the first capacitor and a voltage of the fourth end of the second capacitor to generate a current source control signal and the detection signal. The detection signal indicates that the voltage of the second end of the first capacitor and the voltage of the fourth end of the second capacitor are substantially the same as a reference voltage. The switches are coupled to the first capacitor, the second capacitor, the input terminal, the output terminal and the voltage level detection circuit. The current source is coupled to the output terminal and configured to supply current to the output terminal or to draw current from the output terminal based on the current source control signal. The operation method includes the following step: controlling the second operational stage to operate in the hold phase when the detection signal of the first operational stage indicates the end of the hold phase of the first operational stage, and the detection signal of the third operational stage indicates the end of the hold phase of the third operational stage.

According to this disclosure, the switched capacitor circuit operates according to whether a certain phase of an operational stage has ended, rather than based on a fixed system clock. In comparison with the conventional technology, the switched capacitor circuit provided in this disclosure is flexible in operation and can therefore effectively avoid the errors caused by variations in manufacturing process, voltage and temperature.

These and other objectives of this disclosure no doubt become obvious to those of ordinary skill in the art after reading the following detailed description of the preferred embodiments with reference to the various figures and drawings.

BRIEF DESCRIPTION OF THE DRAWINGS

FIGS. 2A to 2D are flowcharts of the operation method of the switched capacitor circuit according to an embodiment of this disclosure.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes a multi-stage switched capacitor circuit and its operation method. On account of that some or all elements of the switched capacitor circuit could be known, the detail of such elements is omitted provided that such detail has little to do with the features of this disclosure, and that this omission nowhere dissatisfies the specification and enablement requirements. Some or all of the processes of the operation method of the switched capacitor circuit can be performed by the switched capacitor circuit or its equivalent. A person having ordinary skill in the art can choose components or steps equivalent to those described in this specification to carry out this disclosure, which means that the scope of this disclosure is not limited to the embodiments in the specification.

Although the terms "first," "second," etc., may be used herein to describe various elements, these elements should not be limited by these terms. Rather, these terms are only used to distinguish one element from another. For example, a first element could be termed a second element, and, similarly, a second element could be termed a first element, without departing from the scope of the embodiments.

Figure 1A:
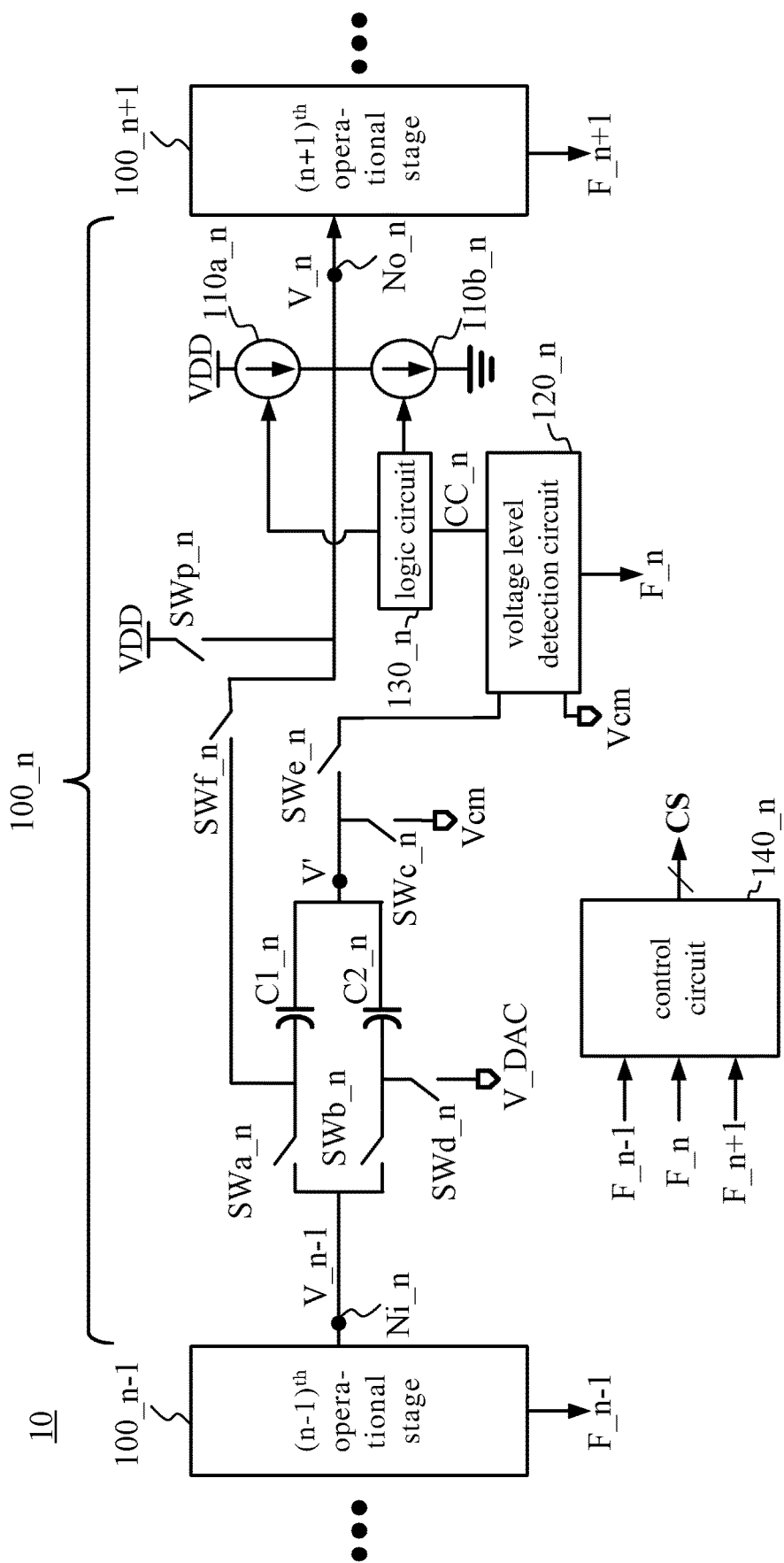
FIGS. 1A and 1B show illustrative circuit diagrams of a switched capacitor circuit according to an embodiment of this disclosure.
Figure 1B:
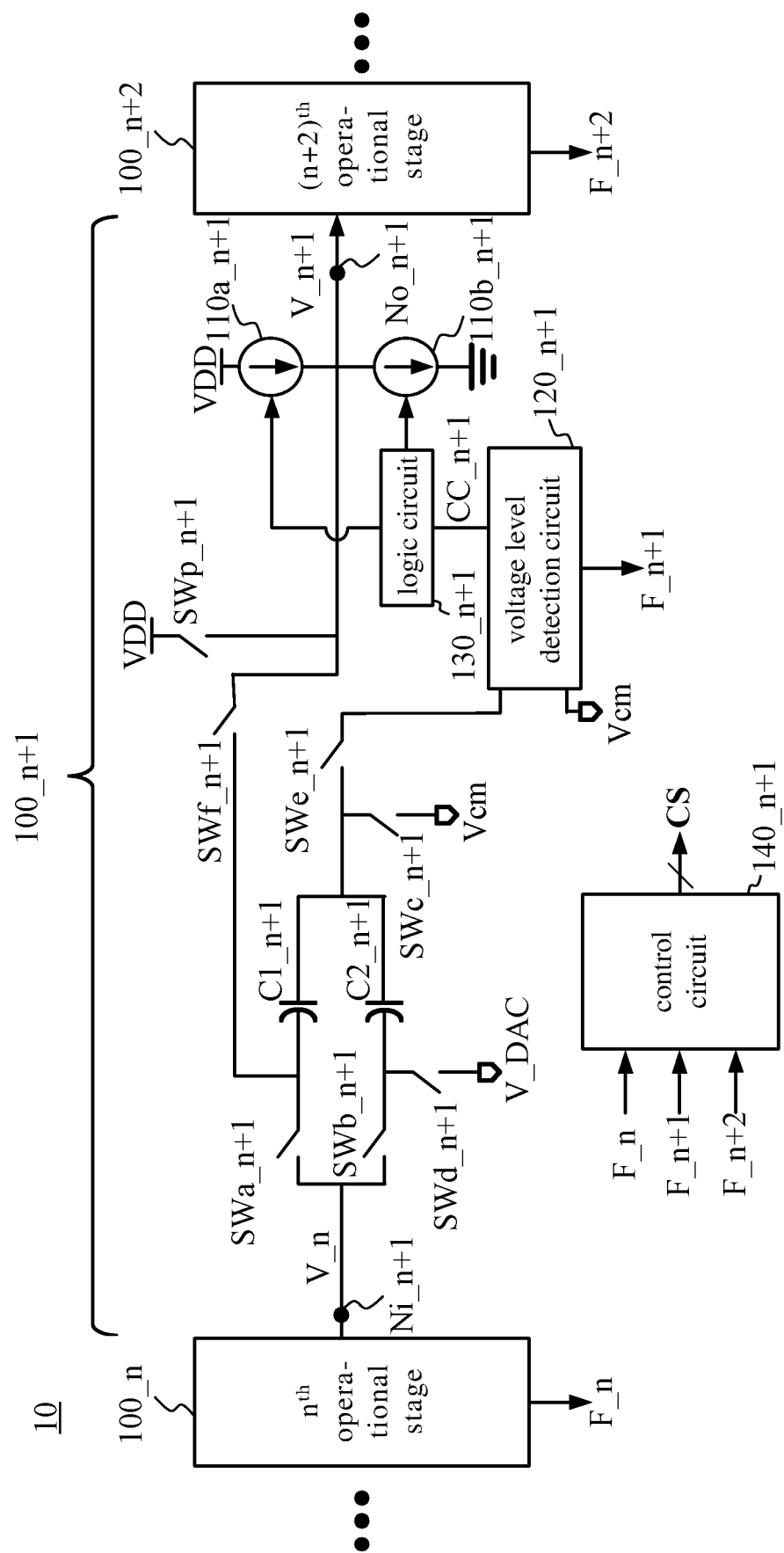

FIGS. 1A and 1B show illustrative circuit diagrams of a switched capacitor circuit according to an embodiment of this disclosure. The switched capacitor circuit 10 includes multiple operational stages connected in series (including at least the $(n-1)^{th}$ operational stage 100_$n$-1, the $n^{th}$ operational stage 100_$n$, the $(n+1)^{th}$ operational stage 100_$n$+1 and the $(n+2)^{th}$ operational stage 100_$n$+2, n being an integer greater than or equal to two), and each operational stage includes substantially the same circuit. The operation details of each operational stage are discussed below by taking the $n^{th}$ operational stage 100_$n$ and the $(n+1)^{th}$ operational stage 100_$n$+1 as an example.

The $n^{th}$ operational stage 100_$n$ includes a capacitor C1_$n$, a capacitor C2_$n$, a switch SWa_n, a switch SWb_n, a switch SWc_n, a switch SWd_n, a switch SWe_n, a switch SWf n, a switch SWp_n, a current source 110$a$_$n$, a current source 110$b$_$n$, a voltage level detection circuit 120_$n$, a logic circuit 130_$n$, a control circuit 140_$n$, an input terminal Ni_n and an output terminal No_n. The input terminal Ni_n is electrically connected to the output terminal No_n-1 (not shown) of the $(n-1)^{th}$ operational stage 100_$n$-1, and the output voltage V_n-1 of the $(n-1)^{th}$ operational stage 100_$n$-1 is the input voltage of the $n^{th}$ operational stage 100_$n$. Similarly, the output terminal No_n is electrically connected to the input terminal Ni_n+1 of the $(n+1)^{th}$ operational stage 100_$n$+1, and the output voltage V_n of the $n^{th}$ operational stage 100_$n$ is the input voltage of the $(n+1)^{th}$ operational stage 100_$n$+1.

The $(n+1)^{th}$ operational stage 100_$n$+1 includes a capacitor C1_$n$+1, a capacitor C2_$n$+1, a switch SWa_n+1, a switch SWb_n+1, a switch SWc_n+1, a switch SWd_n+1, a switch SWe_n+1, a switch SWf n+1, a switch SWp_n+1, a current source 110$a$_n+1, a current source 110$b$_$n$+1, a voltage level detection circuit 120_$n$+1, a logic circuit 130_$n$+1, a control circuit 140_$n$+1, an input terminal Ni_n+1 and an output terminal No_n+1. The output terminal No_n+1 is electrically connected to the input terminal Ni_n+2 (not shown) of the $(n+2)^{th}$ operational stage 100_$n$+2, and the output voltage V_n+1 of the $(n+1)^{th}$ operational stage 100_$n$+1 is the input voltage of the $(n+2)^{th}$ operational stage 100_$n$+2.

The first end of the capacitor C1_$n$ is coupled to the input terminal Ni_n through the switch SWa_n, or is coupled to the output terminal No_n through the switch SWf n. The second end of the capacitor C1_$n$ is coupled to the reference voltage Vcm through the switch SWc_n, or is coupled to the voltage level detection circuit 120_$n$ through the switch SWe_n. The first end of the capacitor C2_$n$ is coupled to the input terminal Ni_n through the switch SWb_n, or is coupled to the reference voltage V_DAC through the switch SWd_n. The second end of the capacitor C2_$n$ is coupled to the reference voltage Vcm through the switch SWc_n, or is coupled to the voltage level detection circuit 120_$n$ through the switch SWe_n. In some embodiments, the reference voltage Vcm may be the common mode voltage of the switched capacitor circuit 10.

The control circuit 140_$n$ generates a control signal CS based on the detection signal F_n-1, the detection signal F_n and the detection signal F_n+1. The control signal CS can control at least one switch of the $n^{th}$ operational stage 100_$n$ and at least one switch of the $(n+1)^{th}$ operational stage 100_$n$+1. The detection signal F_n-1 is generated by the voltage level detection circuit of the $(n-1)^{th}$ operational stage 100_$n$-1 (not shown), the detection signal F_n is generated by the voltage level detection circuit 120_$n$ of the $n^{th}$ operational stage 100_$n$, the detection signal F_n+1 is generated by the voltage level detection circuit 120_$n$+1 of the $(n+1)^{th}$ operational stage 100_$n$+1, and the detection signal F_n+2 is generated by the voltage level detection circuit of the $(n+2)^{th}$ operational stage 100_$n$+2 (not shown). The detection signal F_n-1, the detection signal F_n, the detection signal F_n+1 and the detection signal F_n+2 can be used to respectively indicate whether the hold phase of the $(n-1)^{th}$ operational stage 100_$n$-1, the $n^{th}$ operational stage 100_$n$, the $(n+1)^{th}$ operational stage 100_$n$+1 and the $(n+2)^{th}$ operational stage 100_$n$+2 has ended. FIGS. 2A to 2D are flowcharts of the operation method of the switched capacitor circuit according to an embodiment of this disclosure. References are made to FIGS. 1A to 1B and FIGS. 2A to 2D for the following discussions.

In the sample phase of the $n^{th}$ operational stage 100_$n$, the switch SWa_n, the switch SWb_n and the switch SWc_n are turned on (ON state, conducting), and the switch SWd_n, the switch SWe_n and the switch SWf n are turned off (OFF state, not conducting), so the capacitor C1_$n$ and the capacitor C2_$n$ sample the output voltage V_n-1 of the $(n-1)^{th}$ operational stage 100_$n$-1. When the control circuit 140_$n$ learns from the detection signal F_n-1 that the hold phase of the $(n-1)^{th}$ operational stage 100_$n$-1 has ended (which means that the output voltage V_n-1 has become stable, and the capacitor C1_$n$ and the capacitor C2_$n$ have completed sampling the input voltage), the control circuit 140_$n$ ends the sample phase of the $n^{th}$ operational stage 100_$n$ by controlling the switch SWa_n, the switch SWb_n and the switch SWc_n to be OFF.

When the control circuit 140_$n$ learns from the detection signal F_n-1 and the detection signal F_n+1 that both the hold phase of the (n−1)$^{th}$ operational stage 100_$n$−1 and the hold phase of the (n+1)$^{th}$ operational stage 100_$n$+1 have ended, the control circuit 140_$n$ controls, based on both the detection signal F_n−1 and the detection signal F_n+1, the n$^{th}$ operational stage 100_$n$ to enter the hold phase by controlling the switch SWd_n, the switch SWe_n and the switch SWf n to be ON (step S210 and its sub-step S212 in FIG. 2A), and controls the (n+1)$^{th}$ operational stage 100_$n$+1 to enter the sample phase by controlling the switch SWa_n+1, the switch SWb_n+1 and the switch SWc_n+1 of the (n+1)$^{th}$ operational stage 100_$n$+1 to be ON (step S220 in FIG. 2B).

In the hold phase of the n$^{th}$ operational stage 100_$n$, the control circuit 140_$n$ first controls the switch SWp_n to be ON for a predetermined time period (hereinafter referred to as the pre-charging phase) to remove or eliminate the charges on the capacitor C1_$n$+1 and the capacitor C2_$n$+1 of the (n+1)$^{th}$ operational stage 100_$n$+1. The voltage level detection circuit 120_$n$ is aimed to compare the voltage of the second end of the capacitor C1_$n$ (i.e., the voltage V) and the voltage of the second end of the capacitor C2_$n$ (i.e., the voltage V) with the reference voltage Vcm. When the voltage V crosses the reference voltage Vcm (i.e., when the voltage V changes from being greater than or equal to the reference voltage Vcm to being less than the reference voltage Vcm, or when the voltage V changes from being less than the reference voltage Vcm to being greater than or equal to the reference voltage Vcm), the voltage level detection circuit 120_$n$ changes the voltage level of the current source control signal CC_n.

After the pre-charging phase ends (i.e., the switch SWp_n becomes OFF), the logic circuit 130_$n$ controls the current source 110a_$n$ and the current source 110b_$n$ to be enabled or disabled in response to the current source control signal CC_n. Because the power supply voltage VDD is greater than the reference voltage Vcm, the voltage V is greater than the reference voltage Vcm when the pre-charging phase has just ended, causing the current source control signal CC_n to be at the first level. In response thereto, the logic circuit 130_$n$ generates a control signal to enable the current source 110b_$n$ and disable the current source 110a_$n$ so as to decrease the output voltage V_n. The voltage V decreases as the output voltage V_n drops, until the voltage V becomes less than the reference voltage Vcm, which causes a transition of the current source control signal CC_n from the first level to the second level (which is different from the first level). In response to the transition of the current source control signal CC_n, the logic circuit 130_$n$ generates a control signal to enable the current source 110a_$n$ and disable the current source 110b_$n$, causing the output voltage V_n to rise (the voltage V increases accordingly). In some embodiments, the current that the current source 110a_$n$ supplies is less than the current that the current source 110b_$n$ supplies, such that the voltage V is very close to or substantially the same as the reference voltage Vcm when the voltage V becomes greater than or equal to the reference voltage Vcm again (which is indicated by the transition of the current source control signal CC_n from the second level back to the first level). After the current source control signal CC_n transitions back to the first level from the second level, the logic circuit 130_$n$ disables both the current source 110a_$n$ and the current source 110b_$n$.

In response to the voltage V being very close to or substantially the same as the reference voltage Vcm (which means that the output voltage V_n has become substantially stable, and the current source control signal CC_n has transitioned twice in the hold phase), the voltage level detection circuit 120_$n$ signals to indicate the end of the hold phase of the n$^{th}$ operational stage 100_$n$ by changing the voltage level of the detection signal F_n, based on which, the control circuit 140_$n$ ends the hold phase of the n$^{th}$ operational stage 100_$n$ by controlling the switch SWd_n, the switch SWe_n and the switch SWf n to be OFF (step S230 in FIG. 2C). Based also upon the detection signal F_n, when the hold phase of the n$^{th}$ operational stage 100_$n$ ends, the control circuit 140_$n$+1 of the (n+1)$^{th}$ operational stage 100_$n$+1 ends the sample phase of the (n+1)$^{th}$ operational stage 100_$n$+1 by controlling the switch SWa_n+1, the switch SWb_n+1 and the switch SWc_n+1 to be OFF (step S240 in FIG. 2D). In some embodiments, the control circuit 140_$n$+1 of the (n+1)$^{th}$ operational stage 100_$n$+1 controls the switch SWc_n+1 to be OFF based on the detection signal F_n, and then controls the switch SWa_n+1 and the switch SWb_n+1 to be OFF based on a delayed detection signal F_n. In this way, the correctness of the sampled values of the capacitor C1_$n$+1 and the capacitor C2_$n$+1 can be further ensured.

Figure 3:
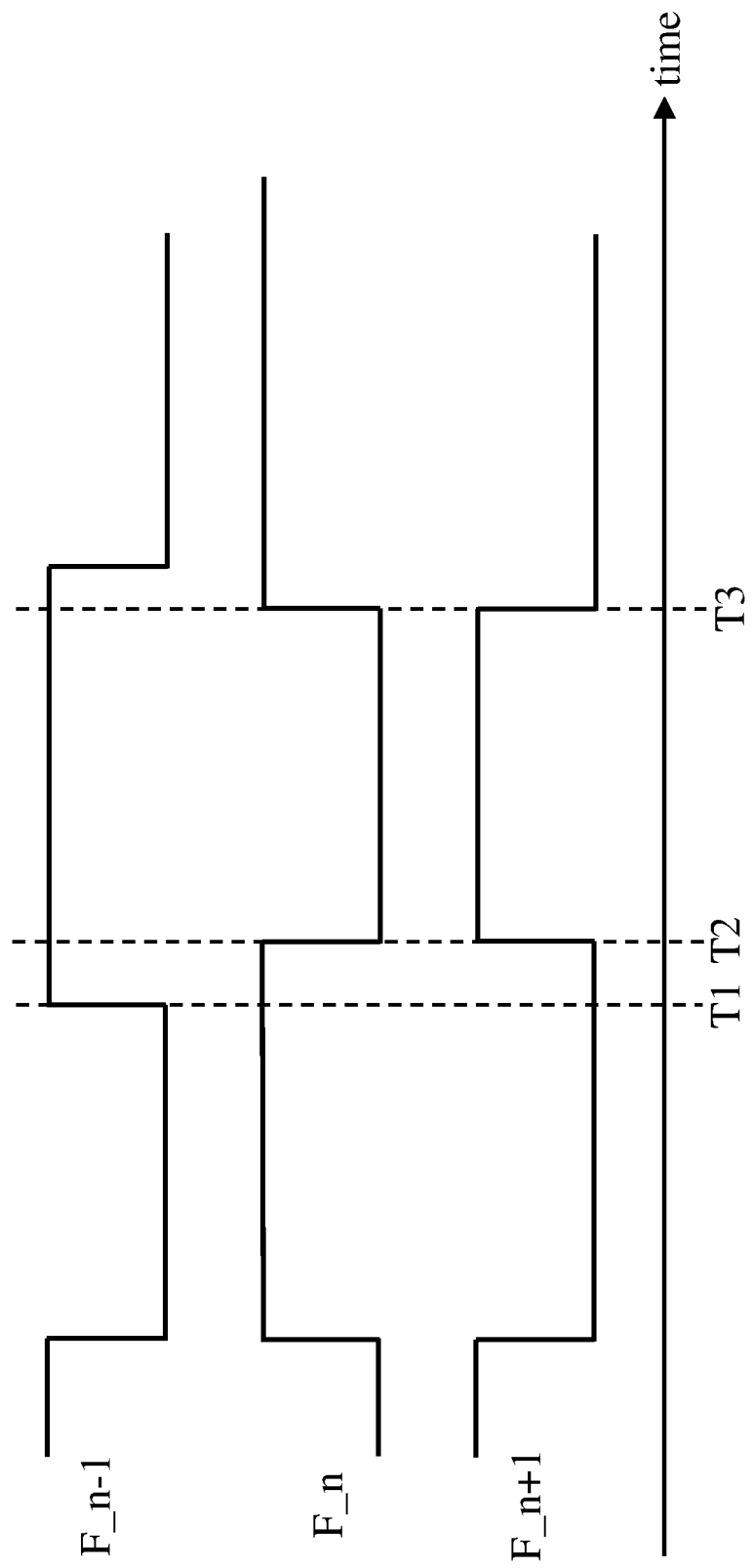
FIG. 3 is a timing diagram according to an embodiment of this disclosure.

FIG. 3 is a timing diagram according to an embodiment of this disclosure. In this example, a transition of the detection signal F_n from a high level to a low level is an indication of the start of the hold phase of the n$^{th}$ operational stage 100_$n$, and a transition of the detection signal F_n from a low level to a high level is an indication of the end of the hold phase of the n$^{th}$ operational stage 100_$n$.

At time point T1, the hold phase of the (n−1)$^{th}$ operational stage 100_$n$−1 ends, and the output voltage V_n−1 has become substantially stable.

At time point T2, the hold phase of the (n−1)$^{th}$ operational stage 100_$n$−1 and the hold phase of the (n+1)$^{th}$ operational stage 100_$n$+1 have both ended. As a result, in response to the detection signal F_n−1 and the detection signal F_n+1 both being high, the control circuit 140_$n$ controls the n$^{th}$ operational stage 100_$n$ to enter the hold phase by controlling the switch SWd_n, the switch SWe_n and the switch SWf n to be ON (step S210 and its sub-step S212 in FIG. 2A), and controls the (n+1)$^{th}$ operational stage 100_$n$+1 to enter the sample phase by controlling the switch SWa_n+1, the switch SWb_n+1 and the switch SWc_n+1 to be ON (step S220 in FIG. 2B). At time point T2, the control circuit 140_$n$ also controls the voltage level detection circuit 120_$n$ to reset the detection signal F_n to a default value (which is low level in this example).

At time point T3, the detection signal F_n is transitioning from a low level to a high level, which is an indication of the end of the hold phase of the n$^{th}$ operational stage 100_$n$ (i.e., the output voltage V_n has become substantially stable). In response to the detection signal F_n being high, the control circuit 140_$n$ controls the switch SWd_n, the switch SWe_n and the switch SWf n to be OFF (step S230 in FIG. 2C). At time point T3, the control circuit 140_$n$+1 controls the switch SWa_n+1, the switch SWb_n+1 and the switch SWc_n+1 to be OFF (step S240 in FIG. 2D).

Figure 4:
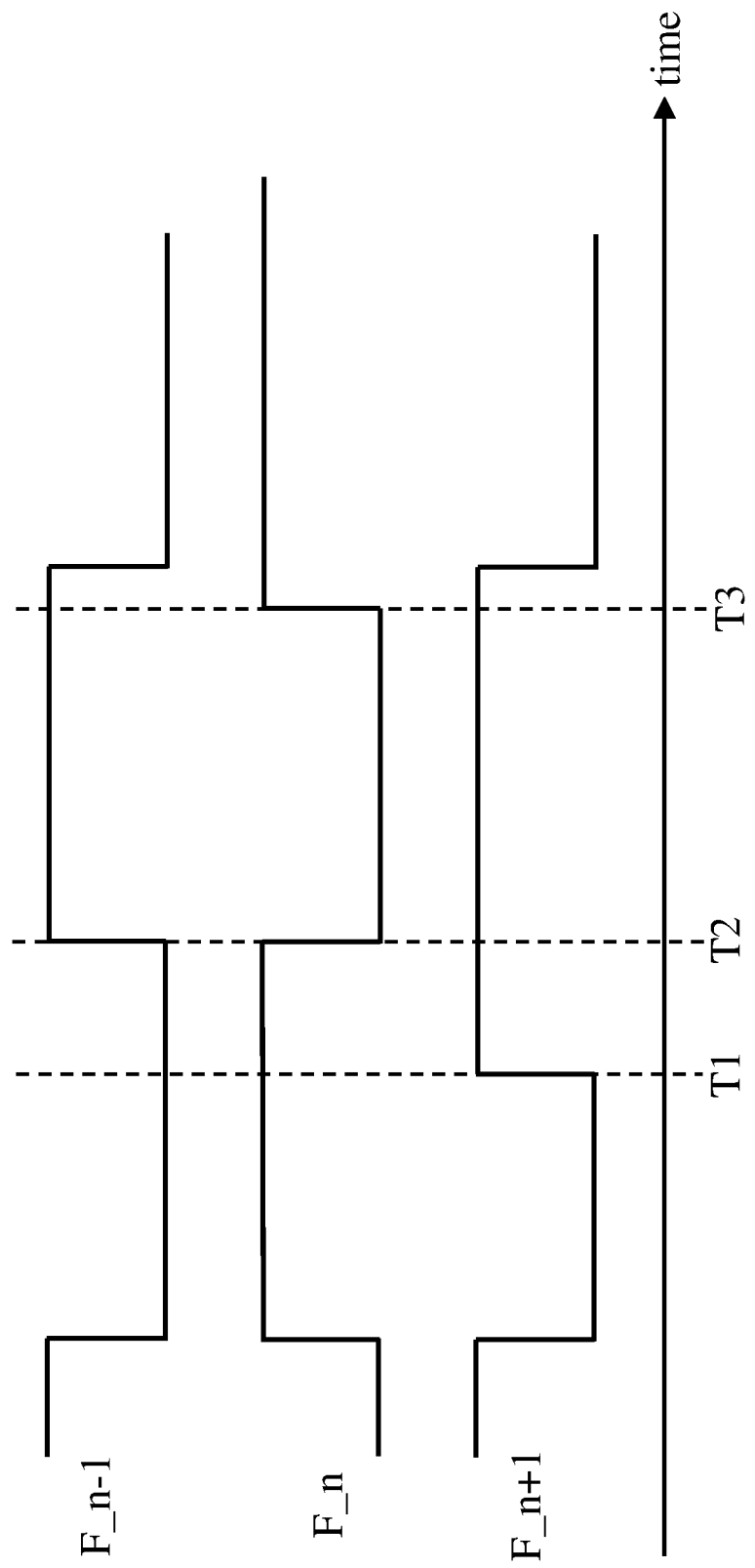
FIG. 4 is a timing diagram according to another embodiment of this disclosure.

FIG. 4 is a timing diagram according to another embodiment of this disclosure. Like the example in FIG. 3, a transition of the detection signal F_n from a high level to a low level is an indication of the start of the hold phase of the n$^{th}$ operational stage 100_$n$, and a transition of the detection signal F_n from a low level to a high level is an indication of the end of the hold phase of the n$^{th}$ operational stage 100_$n$.

At time point T1, the hold phase of the (n+1)$^{th}$ operational stage 100_$n$+1 ends, and the output voltage V_n+1 has become substantially stable.

At time point T2, the hold phase of the (n−1)$^{th}$ operational stage 100_$n$−1 and the hold phase of the (n+1)$^{th}$ operational stage 100_$n$+1 have both ended. As a result, in response to the detection signal F_n−1 and the detection signal F_n+1 both being high, the control circuit 140_$n$ controls the switch SWd_n, the switch SWe_n and the switch SWf n to be ON, so as to control the n$^{th}$ operational stage 100_$n$ to enter the hold phase (step S210 and its sub-step S212 in FIG. 2A), and controls the switches SWa_n+1 and SWb_n+1 and the switch SWc_n+1 to be ON, so as to control the (n+1)$^{th}$ operational stage 100_$n$+1 to enter the sample phase (step S220 in FIG. 2B). At time point T2, the control circuit 140_$n$ also controls the voltage level detection circuit 120_$n$ to reset the detection signal F_n to a default value (low level in this example).

It should be noted that although the hold phase of the (n+1)$^{th}$ operational stage 100_$n$+1 ends at time point T1, the sample phase of the (n+1)$^{th}$ operational stage 100_$n$+1 does not start immediately at time point T1 but rather starts at time point T2.

A transition of the detection signal F_n at time point T3 from a low level to a high level indicates the end of the hold phase of the n$^{th}$ operational stage 100_$n$ (which means that the output voltage V_n has become substantially stable). Therefore, in response to the detection signal F_n being high, the control circuit 140_$n$ controls the switch SWd_n, the switch SWe_n and the switch SWf n to be OFF (step S230 in FIG. 2C). At time point T3, the control circuit 140_$n$+1 controls the switch SWa_n+1, the switch SWb_n+1 and the switch SWc_n+1 to be OFF (step S240 in FIG. 2D).

It can be seen from FIGS. 3 and 4 that the sample phase and the hold phase of the n$^{th}$ operational stage 100_$n$ are not controlled based on the system clock. In other words, the switches of the n$^{th}$ operational stage 100_$n$ are not turned on or off according to the system clock. The hold phase of the n$^{th}$ operational stage 100_$n$ does not start until the hold phases of the adjacent operational stages have both ended, and the hold phase of the n$^{th}$ operational stage 100_$n$ does not end until its own output voltage V_n has become substantially stable (indicated by the detection signal F_n). In such a design, because the durations of the hold phase and sample phase of each stage are not controlled based on the fixed cycle of the system clock, the durations of the hold phase and sample phase of each stage are not fixed, which ensures that each stage has sufficient time to complete the hold phase and sample phase.

Figure 5:
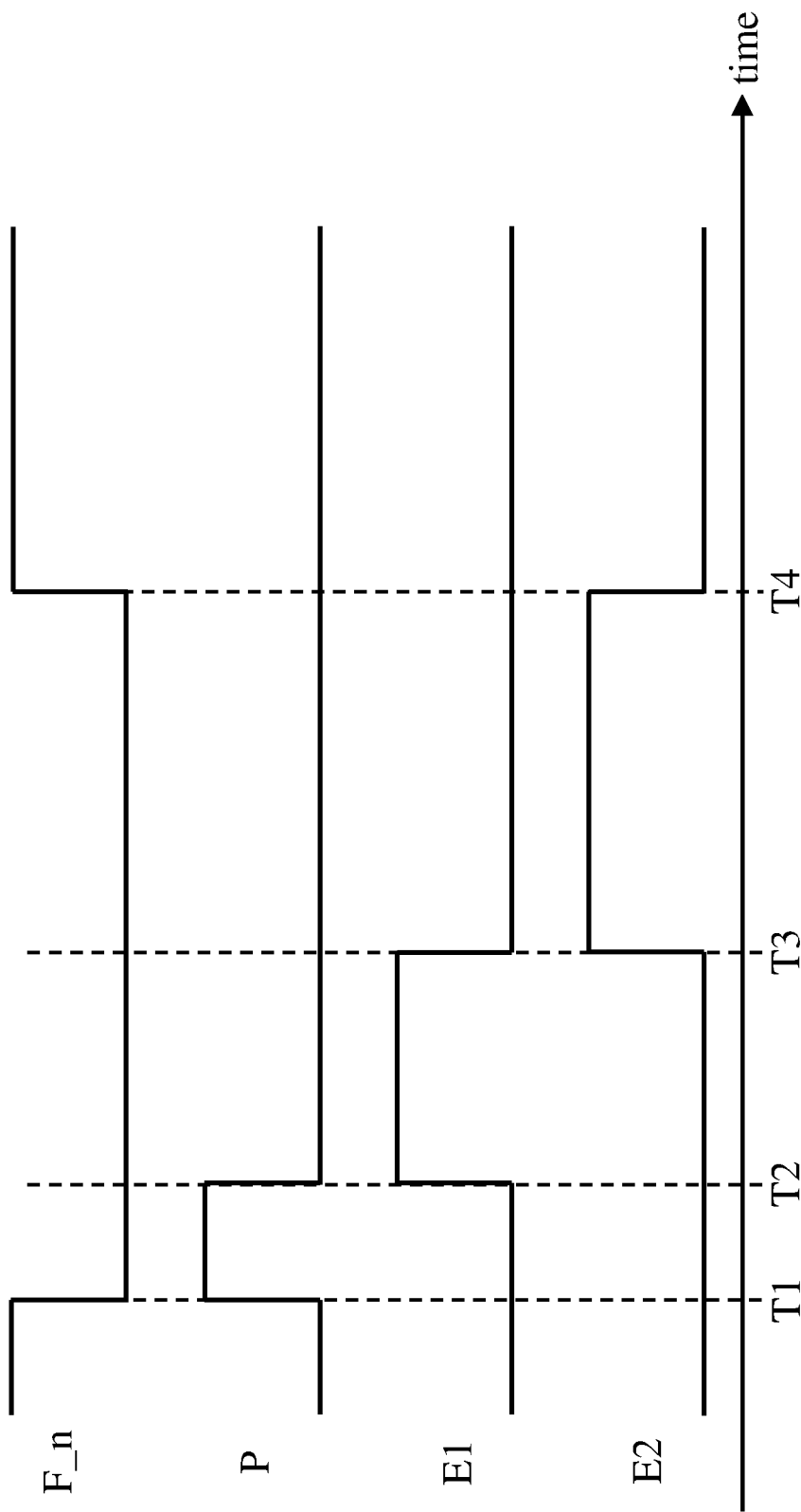
FIG. 5 is a detailed timing diagram of the hold phase according to an embodiment of this disclosure.

FIG. 5 is a detailed timing diagram of the hold phase according to an embodiment of this disclosure. The hold phase includes three sub-phases: phase P, phase E1 and phase E2. After the hold phase starts, the control circuit 140_$n$ first controls the switch SWp_n to be ON in phase P for a predetermined time period (T2−T1), and then the logic circuit 130_$n$ controls the current source 110b_$n$ to be enabled and the current source 110a_$n$ to be disabled in phase E1 (between time points T2 and T3) and controls the current source 110a_$n$ to be enabled and the current source 110b_$n$ to be disabled in the following phase E2 (between time points T3 and T4). After phase E2 ends, the current source 110a_$n$ and the current source 110b_$n$ are both disabled. The time point at which phase E2 ends (T4) is the time point when the detection signal F_n is making a transition, and is also the time point when the hold phase ends.

The aforementioned predetermined time period (T2−T1) is related to the sizes of the capacitors and transistors used in the switched capacitor circuit 10. For example, the predetermined time period (T2−T1) can be set to 5% to 20% of the time period (T4−T1). In some embodiments, the predetermined time period (T2−T1) can be realized by means of the delay of logic gates.

In some embodiments, the voltage level detection circuit 120_$n$ may be a combination of a zero-crossing detector and a level switching circuit. The level switching circuit may be implemented with logic gates and may include a memory circuit (e.g., a register). The zero-crossing detector generates the current source control signal CC_n according to whether the voltage V' and the reference voltage Vcm cross, and the level switching circuit controls, based on the current source control signal CC_n, the transition of the detection signal F_n. In other embodiments, the voltage level detection circuit 120_$n$ may be a combination of a comparator and a level switching circuit. Of the comparator, one of the input terminals receives the voltage V, the other input terminal receives the reference voltage Vcm, and the output terminal outputs the current source control signal CC_n. The level switching circuit controls, based on the current source control signal CC_n, the transition of the detection signal F_n.

The logic circuit 130_$n$ and the control circuit 140_$n$ may be implemented with logic gates. In some embodiments, the logic circuit 130_$n$ and the control circuit 140_$n$ may include a memory circuit (e.g., a register) formed by logic gates. The control circuit 140_$n$ may include a counter and determines the predetermined time period of phase P based on the system clock. People having ordinary skill in the art can realize the logic circuit 130_$n$ and the control circuit 140_$n$ based on the above discussions.

In some embodiments, the circuit shown in FIGS. 1A and 1B is applied to one end of a differential signal pair. Alternatively, the circuit can be applied to the other end of the differential signal pair by simply changing the reference voltage to which the switch SWp_n couples from the power supply voltage VDD to ground. In some embodiments, both ends of the differential signal pair can share the voltage level detection circuit 120_$n$, the logic circuit 130_$n$ and the control circuit 140_$n$. In some embodiments, after the precharging phase ends, the logic circuit 130_$n$ controls the current source 110a_$n$ corresponding to one end of the differential signal pair and the current source 110b_$n$ corresponding to the other end of the differential signal pair together based on the current source control signal CC_n. Correspondingly, the logic circuit 130_$n$ controls the current source 110b_$n$ corresponding to one end of the differential signal pair and the current source 110a_$n$ corresponding to the other end of the differential signal pair based on the current source control signal CC_n.

The switched capacitor circuit 10 provided in this disclosure can ensure that the sampled voltage is correct. When applied to an analog-to-digital converter (ADC), the switched capacitor circuit 10 provided in this disclosure can reduce the bit error rate of that ADC. The ADCs that can use the switched capacitor circuit 10 of this disclosure include, for example, a pipelined ADC (also known as pipeline ADC) and a sigma-delta modulator (SDM)-based ADC.

Since a person having ordinary skill in the art can appreciate the implementation detail and the modification thereto of the present method embodiment through the disclosure of the device embodiment, repeated and redundant description is thus omitted. Please note that there is no step sequence limitation for the method embodiments as long as the execution of each step is applicable. Furthermore, the shape, size, and ratio of any element and the step sequence of any flowchart in the disclosed figures are exemplary for understanding, not for limiting the scope of this disclosure.

The aforementioned descriptions represent merely the preferred embodiments of this disclosure, without any intention to limit the scope of this disclosure thereto. Various equivalent changes, alterations, or modifications based on the claims of this disclosure are all consequently viewed as being embraced by the scope of this disclosure.

What is claimed is:

1. A switched capacitor circuit comprising a first operational stage, a second operational stage and a third operational stage serially connected in sequence, each operational stage generating a detection signal, the first operational stage, the second operational stage and the third operational stage each comprising:
  an input terminal;
  an output terminal;
  a first capacitor, having a first end and a second end;
  a second capacitor, having a third end and a fourth end;
  a voltage level detection circuit, configured to detect a voltage of the second end of the first capacitor and a voltage of the fourth end of the second capacitor to generate a current source control signal and the detection signal, wherein the detection signal indicates that the voltage of the second end of the first capacitor and the voltage of the fourth end of the second capacitor are substantially the same as a reference voltage;
  a plurality of switches, coupled to the first capacitor, the second capacitor, the input terminal, the output terminal and the voltage level detection circuit;
  a current source, coupled to the output terminal and configured to supply current to the output terminal or to draw current from the output terminal based on the current source control signal; and
  a control circuit, coupled to the switches and configured to control the switches based on the detection signal of the first operational stage, the detection signal of the second operational stage and/or the detection signal of the third operational stage without referring to any clock.

2. The switched capacitor circuit of claim 1, wherein the reference voltage is a first reference voltage, and, based on both the detection signal of the first operational stage and the detection signal of the third operational stage, the control circuit of the second operational stage controls the first end of the first capacitor of the second operational stage to be electrically connected to the output terminal of the second operational stage, controls the third end of the second capacitor of the second operational stage to receive a second reference voltage, and controls the second end of the first capacitor of the second operational stage and the fourth end of the second capacitor of the second operational stage to be electrically connected to the voltage level detection circuit of the second operational stage.

3. The switched capacitor circuit of claim 1, wherein the reference voltage is a first reference voltage, and, based on the detection signal of the second operational stage, the control circuit of the second operational stage controls the first end of the first capacitor of the second operational stage not to be electrically connected to the output terminal of the second operational stage, controls the third end of the second capacitor of the second operational stage not to receive a second reference voltage, and controls the second end of the first capacitor of the second operational stage and the fourth end of the second capacitor of the second operational stage not to be electrically connected to the voltage level detection circuit of the second operational stage.

4. The switched capacitor circuit of claim 1, wherein, based on both the detection signal of the first operational stage and the detection signal of the third operational stage, the control circuit of the second operational stage controls the first end of the first capacitor of the third operational stage and the third end of the second capacitor of the third operational stage to be electrically connected to the input terminal of the third operational stage, and controls the second end of the first capacitor of the third operational stage and the fourth end of the second capacitor of the third operational stage to receive the reference voltage.

5. The switched capacitor circuit of claim 1, wherein, based further on the detection signal of the first operational stage, the control circuit of the second operational stage controls the first end of the first capacitor of the second operational stage and the third end of the second capacitor of the second operational stage not to be electrically connected to the input terminal of the second operational stage, and controls the second end of the first capacitor of the second operational stage and the fourth end of the second capacitor of the second operational stage not to receive the reference voltage.

6. An operation method of a switched capacitor circuit, the switched capacitor circuit comprising a first operational stage, a second operational stage and a third operational stage serially connected in sequence, each operational stage operating in a sample phase or a hold phase and generating a detection signal indicating an end of the hold phase, the operation method comprising:
  controlling the second operational stage to operate in the hold phase when the detection signal of the first operational stage indicates the end of the hold phase of the first operational stage, and the detection signal of the third operational stage indicates the end of the hold phase of the third operational stage;
  wherein the first operational stage, the second operational stage and the third operational stage each comprises:
  an input terminal;
  an output terminal;
  a first capacitor having a first end and a second end;
  a second capacitor having a third end and a fourth end;
  a voltage level detection circuit, configured to detect a voltage of the second end of the first capacitor and a voltage of the fourth end of the second capacitor to generate a current source control signal and the detection signal, wherein the detection signal indicates that the voltage of the second end of the first capacitor and the voltage of the fourth end of the second capacitor are substantially the same as a reference voltage;
  a plurality of switches, coupled to the first capacitor, the second capacitor, the input terminal, the output terminal and the voltage level detection circuit; and
  a current source, coupled to the output terminal and configured to supply current to the output terminal or to draw current from the output terminal based on the current source control signal.

7. The operation method of claim 6, wherein the reference voltage is a first reference voltage, the operation method further comprising performing following actions based on both the detection signal of the first operational stage and the detection signal of the third operational stage:
  controlling the first end of the first capacitor of the second operational stage to be electrically connected to the output terminal of the second operational stage, controlling the third end of the second capacitor of the second operational stage to receive a second reference voltage, and controlling the second end of the first capacitor of the second operational stage and the fourth end of the second capacitor of the second operational stage to be electrically connected to the voltage level detection circuit of the second operational stage.

8. The operation method of claim 6, wherein the reference voltage is a first reference voltage, the operation method further comprising performing following actions based on the detection signal of the second operational stage:

controlling the first end of the first capacitor of the second operational stage not to be electrically connected to the output terminal of the second operational stage, controlling the third end of the second capacitor of the second operational stage not to receive a second reference voltage, and controlling the second end of the first capacitor of the second operational stage and the fourth end of the second capacitor of the second operational stage not to be electrically connected to the voltage level detection circuit of the second operational stage.

9. The operation method of claim 6, further comprising performing following actions based on both the detection signal of the first operational stage and the detection signal of the third operational stage:

controlling the first end of the first capacitor of the third operational stage and the third end of the second capacitor of the third operational stage to be electrically connected to the input terminal of the third operational stage, and controlling the second end of the first capacitor of the third operational stage and the fourth end of the second capacitor of the third operational stage to receive the reference voltage.

10. The operation method of claim 6, further comprising performing following actions based on the detection signal of the first operational stage:

controlling the first end of the first capacitor of the second operational stage and the third end of the second capacitor of the second operational stage not to be electrically connected to the input terminal of the second operational stage, and controlling the second end of the first capacitor of the second operational stage and the fourth end of the second capacitor of the second operational stage not to receive the reference voltage.

11. A switched capacitor circuit comprising a first operational stage, a second operational stage and a third operational stage serially connected in sequence, each operational stage generating a detection signal, the first operational stage, the second operational stage and the third operational stage each comprising:

an input terminal;
an output terminal;
a first capacitor, having a first end and a second end;
a second capacitor, having a third end and a fourth end;
a voltage level detection circuit, configured to detect a voltage of the second end of the first capacitor and a voltage of the fourth end of the second capacitor to generate a current source control signal and the detection signal, wherein the detection signal indicates that the voltage of the second end of the first capacitor and the voltage of the fourth end of the second capacitor are substantially the same as a reference voltage;

a plurality of switches, coupled to the first capacitor, the second capacitor, the input terminal, the output terminal and the voltage level detection circuit;
a current source, coupled to the output terminal and configured to supply current to the output terminal or to draw current from the output terminal based on the current source control signal; and
a control circuit, coupled to the switches;
wherein the control circuit of the second operational stage is configured to control the switches based on the detection signal of the first operational stage and/or the detection signal of the third operational stage.

12. The switched capacitor circuit of claim 11, wherein the reference voltage is a first reference voltage, and, based on both the detection signal of the first operational stage and the detection signal of the third operational stage, the control circuit of the second operational stage controls the first end of the first capacitor of the second operational stage to be electrically connected to the output terminal of the second operational stage, controls the third end of the second capacitor of the second operational stage to receive a second reference voltage, and controls the second end of the first capacitor of the second operational stage and the fourth end of the second capacitor of the second operational stage to be electrically connected to the voltage level detection circuit of the second operational stage.

13. The switched capacitor circuit of claim 11, wherein the reference voltage is a first reference voltage, and, based on the detection signal of the second operational stage, the control circuit of the second operational stage controls the first end of the first capacitor of the second operational stage not to be electrically connected to the output terminal of the second operational stage, controls the third end of the second capacitor of the second operational stage not to receive a second reference voltage, and controls the second end of the first capacitor of the second operational stage and the fourth end of the second capacitor of the second operational stage not to be electrically connected to the voltage level detection circuit of the second operational stage.

14. The switched capacitor circuit of claim 11, wherein, based on both the detection signal of the first operational stage and the detection signal of the third operational stage, the control circuit of the second operational stage controls the first end of the first capacitor of the third operational stage and the third end of the second capacitor of the third operational stage to be electrically connected to the input terminal of the third operational stage, and controls the second end of the first capacitor of the third operational stage and the fourth end of the second capacitor of the third operational stage to receive the reference voltage.

15. The switched capacitor circuit of claim 11, wherein, based further on the detection signal of the first operational stage, the control circuit of the second operational stage controls the first end of the first capacitor of the second operational stage and the third end of the second capacitor of the second operational stage not to be electrically connected to the input terminal of the second operational stage, and controls the second end of the first capacitor of the second operational stage and the fourth end of the second capacitor of the second operational stage not to receive the reference voltage.

* * * * *